United States Patent [19]

Kumar

[11] 4,442,137
[45] Apr. 10, 1984

[54] MASKLESS COATING OF METALLURGICAL FEATURES OF A DIELECTRIC SUBSTRATE

[75] Inventor: Ananda H. Kumar, Wappingers Falls, N.Y.

[73] Assignee: International Business Machines Corporation, Armonk, N.Y.

[21] Appl. No.: 359,444

[22] Filed: Mar. 18, 1982

[51] Int. Cl.³ .......................... B05D 3/12; B05D 5/12
[52] U.S. Cl. ........................................ 427/57; 427/96; 427/99; 427/259; 427/264; 427/266
[58] Field of Search ................... 427/57, 99, 259, 264, 427/96, 98, 266; 204/192 C

[56] References Cited

U.S. PATENT DOCUMENTS

| | | | |
|---|---|---|---|
| 3,698,941 | 10/1972 | Nobel et al. | 427/57 |
| 3,736,167 | 5/1973 | Bachman et al. | 427/98 |
| 3,853,613 | 12/1974 | Wilting | 427/57 |
| 4,206,254 | 6/1980 | Schmeckenbecher | 427/259 |
| 4,232,059 | 11/1980 | Proffitt | 427/96 |

OTHER PUBLICATIONS

IBM TDB, vol. 15, No. 9, Feb. 1973, p. 2855, Selective Metallization of Ceramic Substrates, G. Kaus et al.
IBM TDB, V. 19, N. 10, Mar. 1977, p. 3777, Protection Against Corrosion of Molybdenum Metallurgy in Multilayer Ceramic Modules, A. Brunsch et al.

Primary Examiner—Evan K. Lawrence
Attorney, Agent, or Firm—Henry Powers

[57] ABSTRACT

Maskless technique for plating a protective metal layer on existing metallurgical pattern supported on a dielectric substrate by blanket coating said metal layer over said substrate, heating to diffuse the metal into said pattern, cooling to spall the metal on the non-patterned portions of the substrate surfaces by the stresses induced from the differences in the thermal contraction differentials between the metal and the substrate, and mechanically removing the metal layer from the non-patterned substrate surfaces. Optionally, the metal layer can also be blanket coated with a passivating metal film with interdiffusion between them at their interface during the noted heating step. In application to support carriers for mounting of semiconductor devices, the substrate will comprise an alumina based ceramic, the pattern will comprise a molybdenum based metal, and the protective metal layer can comprise a nickel based metal. In this application, the second passivating metal film can comprise gold.

21 Claims, 7 Drawing Figures

MASKLESS COATING OF METALLURGICAL FEATURES OF A DIELECTRIC SUBSTRATE

DESCRIPTION

Related Applications

Concurrent U.S. application Ser. No. 359,469 filed Mar. 18, 1982 by A. H. Kumar and K. V. Srikrishnan for "Selective Coating" of Metallurgical Features On a Dielectric Substrate with Diverse Metallization"; and Ser. No. 359,445 filed Mar. 18, 1982 by A. H. Kumar for "Thin Film Floating Zone Metal Coating Technique".

Technical Field

This invention relates to a method of depositing metal layers on an existing metallurgy pattern carrier on a supporting dielectric substrate, and more particularly for coating protective metal coatings on refractive metal condutive patterns on ceramic substrate carriers employed for mounting semiconductor devices thereon.

Accordingly, it is an object of the present invention to provide a novel method for metal cladding existing metallurgy patterns on a dielectric substrate.

It is another object of this invention to provide a novel method of selectively depositing a diverse metal coating on an existing metal pattern of a dielectric substrate.

A further object of this invention is to provide a novel maskless method for metal coating an existing metallurgical pattern on a dielectric substrate with a diverse metal.

A further object of the present invention is to provide a novel method for fabrication of improved metallized dielectric substrate carriers for mounting of semiconductor devices thereon.

An additional object of the present invention is to provide a maskless technique for replacing electroless plated nickel coatings on molybdenum metallurgy patterns on a ceramic substrate carriers employed for mounting of semiconductor devices thereon.

Background Art

The multi-layer ceramic (MLC) technology for fabricating dielectric substrate carriers for integrated circuit/semiconductor package assemblies is well known. Such MLC substrates are produced by preparing a slurry of a suitable ceramic particulates (e.g. alumina), a fugitive resin binder material, a solvent for the resin binder, normally with an included plasticizer; doctor blading the slurry on removable base with subsequent drying to form thin flexible sheets commonly termed ceramic green sheets. The sheets are then punched to form via holes, and the via holes filled with conductive metalliferous (e.g. molybdenum) paste which is also formed into a pattern of conductive lines which will ultimately form the internal circuitry of the MLC. The punched and printed green sheets are selectively stacked on each other into a laminated substrate assembly, as for example, a stack of 15 to 30 green sheets, and the assembly sintered to integrate the sheets and develop the conductor pattern while removing the binder. The resultant fired MLC substrate can then be employed for flip-chip mounting of semiconductor devices which are electrically connected to the internal circuitry of the MLC substrate.

External contact with the MLC substrate is made by a plurality of I/0 pins normally brazed or otherwise mounted to the opposite side of the MLC substrate to the internal circuitry thereof. It is desirable that the MLC substrate be formed with vias and lines densified in accordance with the corresponding microminiturization of the integrated circuit developments. Such microminiaturization is desirable in order that the package be compatible with the corresponding densified integrated circuit device chips mounted thereon. In such application the MLC substrate must be provided on the top surface with many small pads which are capable of making registered electrical contact with corresponding closely spaced semiconductor device terminals, e.g. solder mounds. In order to more efficiently use the modern integrated circuit technology, as many as possible integrated circuit devices are supported on and interconnected within the MLC substrate. Such an arrangement keeps the distances between interconnected devices small and thereby minimizes the time it takes for electrical signals to travel between the interrelated devices. Also this reduces the number of electrical connections which must be made thereby reducing the cost of the package and increases reliability. The end result is a highly complex MLC package with a lot of small internal printed circuitry contained in a substrate carrier capable of mounting large numbers of integrated circuit devices.

Further, such MLC substrates require a relatively complex metallurgy on the topside to make electrical connection to integrated circuit devices and to provide engineering change pads, and on the bottom side to make connection to the I/0 pads, pins or other type connections. When green ceramic is sintered there is normally a 17 to 20% shrinkage. Frequently, the shrinkage is not uniform throughout the MLC substrate. Since the substrate is relatively large, and the metallurgy geometry quite small, it is difficult and frequently impossible to produce a mask for coating protective diverse metals on the substrate metallurgy, that is 17 to 20% smaller than the original substrate that will have all open areas that will coincide or register with the substrate metallurgy. Such a mask is necessary for depositing additional metallurgy metals using conventional masking techniques. Usually the original metallurgy pattern on the MLC substrate laminate deposited prior to sintering and comprises a refractory (for example molybdenum) metalliferous paste screened on the laminate sheets. After sintering, the refractory metal (e.g. molybdenum, tungsten, etc.) must not only be protectively covered with different metals, as for example nickel, chromium, copper, gold, etc., but also to facilitate the making of connections, as by soldering, to semiconductor devices, compression bonding to wires and/or brazing to I/0 pins. The protective coating of the refractive MLC substrate metallurgy, where molybdenum is employed is important, since molybdenum is susceptible to reactive corrosion when exposed to humidity of any pH value at operating potentials common in MLC module or substrate applications. This corrosion interrupts conductors, and leads to module failure.

One method of protecting the substrate metallurgy is by covering them with diverse metals, e.g. nickel, by electroless plating techniques which do not require masks. However, such coatings may contain impurities such as phosphorous boron, etc., which may be objectionable in subsequent joining (e.g. soldering, brazing, compression bonding, etc.).

The protective metal layers can also be deposited by electroplating techniques. However, such plating techniques require electrical connection to each area to be plated, whereas in MLC substrates such connections are not always available, since some pads or portions of the metallurgy pattern can be "electrically floating".

These electroless and electroplating techniques are expensive time consuming and difficult to control; and thus there is a need for a maskless plating technique which is simple with elimination of processing steps as well as having a significant improvement in yield without problems of phosphorous and/or boron contamination.

Summary of the Invention

In its broadest context, this invention provides a maskless technique for replacing electroless and electroplating approaches of coating protective metallization on existing metallurgy supported on a dielectric substrate, by blanket coating, e.g. evaporation, sputtering, etc., a protective metallization over a dielectric substrate having an existing diverse metallurgy pattern, heating to diffuse the protective metallization into the existing metallurgy, cooling the substrate to disrupt or spall the protective metal on the non-metallized portions of the substrate, and mechanically removing the protective metallization, preferably ultrasonically, from the substrate surfaces.

In specific application to the semiconductor art utilizing alumina MLC substrates with an existing refractory metal, e.g. molybdenum, pattern, the substrate is blanket coated with a protective metal, e.g. nickel, heated to diffuse nickel into the refractory metal, e.g. molybdenum, cooled to disrupt or spall the metal on the ceramic surface, with removal of the protective metallization (e.g. ultrasonically) from the ceramic surfaces.

With illustrative reference to the application to the fabrication of support carriers or modules for mounting semiconductor devices which employs alumina MLC substrates with an existing molybdenum based metallurgy pattern protectively coated with nickel based metallization in accordance with this invention, it is noted that during post-diffusion cooling of the MLC substrate, the differential thermal contractions of the nickel film and the ceramic body set up stresses that cause the nickel/ceramic adhesion to be completely disrupted. Upon ultrasonic treatment, the loose nickel film on the ceramic is removed leaving a ceramic substrate surface where only the molybdenum circuit features will remain coated with an adherent nickel coating.

Where processing considerations require passivation of the nickel cladding with another diverse metal, such as gold, such passivation can be effected concurrently with the diffusion of nickel into the molybdenum metallurgy. In this respect, prior to the diffusion step, the nickel layer can be further blanket coated with a passivating metal, e.g. gold, as by sputtering, whereby the nickel and gold will interdiffuse concurrently with the nickel diffusion into the molybdenum metallurgy on heating. This can be attained if the nickel cladding process can be carried out at diffusion temperatures not exceeding about 750° C., well within the Au-Ni immiscibility dome. In an illustrative example employing molybdenum circuit features of an alumina MLC, both are blanket coated, as by sputtering with from about 3 to about 7 microns of nickel, a gold film of about 0.25 to 0.5 microns thickness can be sputtered over the nickel layer, which on heating will effect simultaneous Ni-Mo and Ni-Au interdiffusions at temperatures below 750° C. The upper limit to Ni-Au diffusion is set by the need to ensure the formation of an oxidation resistant gold-rich Au-Ni solid solution. This is assured below 750° C. by the existance of the immiscibility dome in the Au-Ni phase diagram.

The advantage of this variation lies in the fact that it provides for maskless cladding of the molybdenum circuit features of the alumina MLC substrate with a nickel film rich in gold at its surface essentially similar to the cap structures heretofore obtained by electroless nickel plating followed by gold plating and gold diffusion techniques.

Although the invention has been referenced specifically to the passivation of molybdenum circuit features of alumina MLC's employed for semiconductor device packaging applications, it is to be understood that the scope of this invention is not to be limited thereto, nor restricted to nickel coatings nor restricted to applications involving MLC substrates. This invention is comprehended for other applications such as decorative metal cladding, glass-to-metal or ceramic-to-metal sealing, as well as to other applications wherein the concept of selective metallization involving diffusion bonding of a deposited metal film selectively to metal features embedded in glass or ceramic with concurrent spalling of the deposited film from the glass or ceramic surface followed by ultrasonic removal of the non-adhering films from the ceramic or glass surfaces.

Brief Description of the Drawings

In the accompanying drawings forming a material part of this disclosure

FIGS. 2A to 4A show schematic cross-sectional view of a variation of the method of a further structure in accordance with this invention.

Description of Preferred Embodiments

For further comprehension of the invention, and of the objects and advantages thereof, reference will be had to the following descriptions and accompanying drawings and to the appended claims in which the various novel features of the invention are more particularly set forth.

Figure 1:
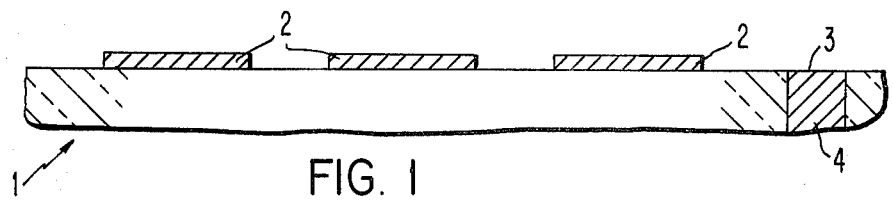
FIGS. 1 to 4 show schematically in cross-sectional views, and broken section, various stages of the method of this, invention.

Referring to FIG. 1, there is depicted a fired ceramic substrate 1, typically a multi-layer ceramic structure which can be produced by the method described in U.S. Pat. No. 3,518,756. Although FIGS. 1 to 4 are illustrated in broken section, the internal metallurgical pattern in the substrate is not shown since it does not constitute a material part of this invention, which is directed to the treatment of existing exposed metallurgy 2 at the surfaces of substrate 1. However, it is to be understood that substrate 1 need not be a multi-layer structure, but could be solid with the metallurgical pattern 2 formed entirely on the surface thereof. Also, it is noted that the metallurgical pattern 2 can be disposed on more than one surface of the substrate, e.g. in MLC structures the existing metallurgical pattern cannot only be provided on the top surface of substrate 1 for electrical connection to terminal of a semiconductor device solder mounted thereto, but also extend to and at the opposite bottom surface of substrate 1 for securing thereto of I/0 pins. Also, although the metallurgy 2 has been shown as extending in a raised pattern on substrate 1, it can also constitute the exposed portions 3 of via metallurgy 4.

The material of present conventional substrates is normally formed of alumina, or alumina plus other materials (e.g. glass) such as described in U.S. Pat. No. 3,540,894. The depicted metallurgical pattern 2, shown on the surface of substrate 1 can be formed of a refractory metal, typically molybdenum, which was deposited prior to sintering.

Figure 2:
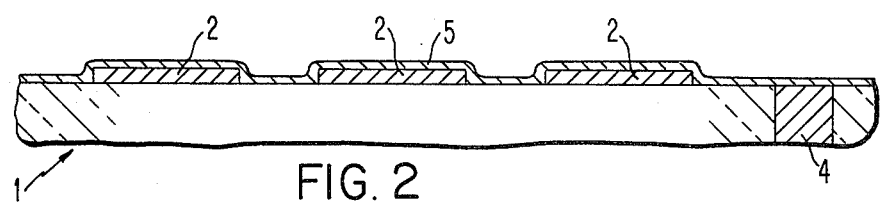

As shown in FIG. 2, the substrate 1 is blanket coated by any suitable technique (as by vacuum deposition, sputtering and the like) with a diverse protective metal layer 5, illustratively to a thickness of about 3 to about 7 microns ($\mu$m), which can be diffused into the existing metallurgy 2 to thereby selectively increase the adherence to the metallurgical circuit features. On deposition the metal will also be adhered to the substrate surfaces. Although various protective metals, such as gold, chrome and the like can be used, a presently preferred metal is nickel to conform to its present day use by immediate replacement of the current electroless and electro plating operations.

Figure 3:
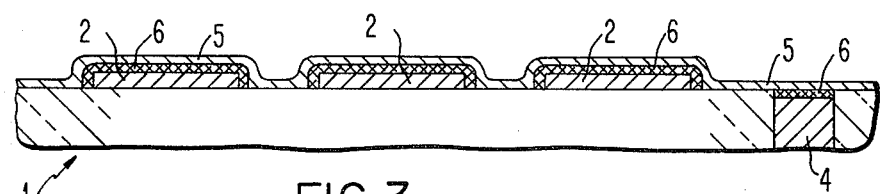

In the next operation, the blanket coated structure of FIG. 2 is heated to a temperature (below the melting points of the metals) to induce interdiffusion of the metals at the interface therebetween, e.g. the diffusion of the protective metal 5 into the existing metallurgical pattern 2. Utilizing a thickness of 5 $\mu$m of nickel as a protective coating 5 and molybdenum based metal for the existing metallurgy, adequate diffusion of nickel into the molybdenum was obtained with a heat treatment of 5 minutes at temperatures from 650° C. to 1100° C. The resultant diffused region 6 is shown in FIG. 3.

This heat treatment is for the purpose of diffusion bonding of the protective metal film 5 to circuit features of the preexisting metallurgical pattern 2, and the sintering of the deposited film 5 of relatively open grain structure to obtain a good lateral adhesion in the film, and to facilitate its removal from the non-metallized or bare surfaces of the substrate.

Preconditioning of substrate 1 for the debonding or delamination of the initially adherent protective film 5 from the bare surfaces of substrate is obtained during cooling thereof, as a result of the stresses induced by the differential in the thermal contraction coefficients of the metal film 5 and the dielectric composition, which disrupts or spalls the metal film 5 on the bare surfaces of the substrate.

On cooling, the metal film 5 is rendered non-adhering to the bare substrate surface, and at this point can be mechanically removed, preferably by subjecting it to an ultrasonic cleaning operation in water or other suitable medium, in conventional tank type ultrasonic cleaners having side and/or bottom mounted transducers. The mechanism of film removal in ultrasonic cleaning involves the rupturing of the loose metal film 5 from the substrate areas by the action of the shock waves impinging on the surfaces. The shock waves being induced by bubble collapse (cavitation) within the liquid medium during the ultrasonic action. One preferred form of removing the metal film 5 is by use of an ultrasonic horn to focus and deliver very high local intensities of energy (about 100 watts per cm$^2$) and by utilizing the near field characteristics of the ultrasonic field close (e.g. about 1 to about 10 mm) to the horn surface where cavitation plays only a minor role. Under such conditions, the removal of the loosely adherent metal films 5 from the substrate surface is very efficient. For example, non-adhering nickel films of 5 $\mu$m thickness can be removed from alumina ceramic surfaces in about 5 to about 30 seconds.

Figure 4:
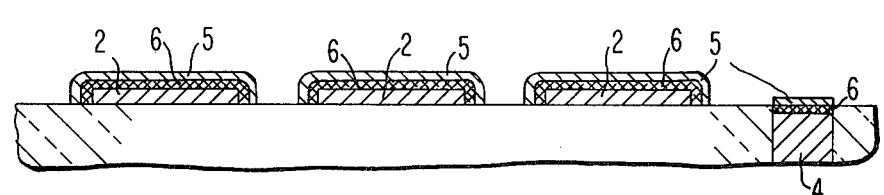

It is believed that the mechanism of metal film removal is as follows: In the near-field region, there exists a coupling of the ultrasonic field (generated by the transducer) to the surface of the substrate carrying the metal film. Where the metal film 5 is strongly adhering to the substrate, such as in areas of the pre-existing metallurgical circuit features under the film, the ultrasonic energy is merely transmitted through the metal film 5 into the substrate and dissipated. Where the metal film 5 is non-adhering, such as on the bare substrate surface areas, the ultrasonic energy is substantially absorbed by the thin metal film 5, causing it to vibrate with the field. This vibration generates alternating stresses at points of the film where it adheres to the substrate which eventually causes the film breakage at these points. High frequencies (e.g. 10–40 KHz) of the field ensures that from $10-40 \times 10^3$ cycles of alternating stress is applied to the metal film 5 at the boundaries of adhering regions so that the fatigue limit for the film is reached in 1 to 30 seconds depending on the nature of the metal film, its thicknesses, and the distance between adjacent adhering areas. With the complete removal of the non-adhering metal film 5 from the substrate surfaces, only the pre-existing metallurgical circuit features 2 on the substrate will retain an adherent metal film 5/6, as shown in FIG. 4.

Figure 2A:
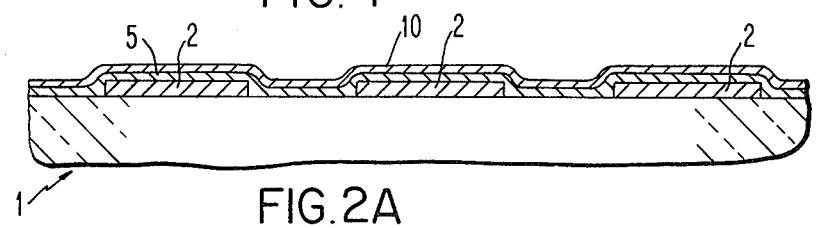
Figure 3A:
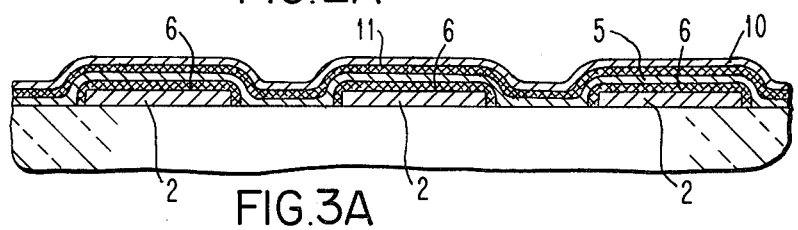

The present invention can also accommodate the inclusion of passivating metal films for the protective film, e.g. gold plating of the protective nickel film 5, if the nickel cladding is carried out at diffusion temperatures not exceeding about 750° C., well within the Au-Ni immiscibility dome. This can be accomplished by depositing (e.g. vacuum evaporation, sputtering, and the like) a film 10 of gold (0.25 to 0.5 $\mu$m) on top of the deposited nickel film 5 (as shown in FIG. 2A) and carrying out the simultaneous Ni-Mo and Au-Ni solid solution, e.g. 6 and 11 of FIGS. 3A and 4A. This is assured below 750° C. by the existance of the immiscibility dome in the Au-Ni phase diagram.

Figure 4A:
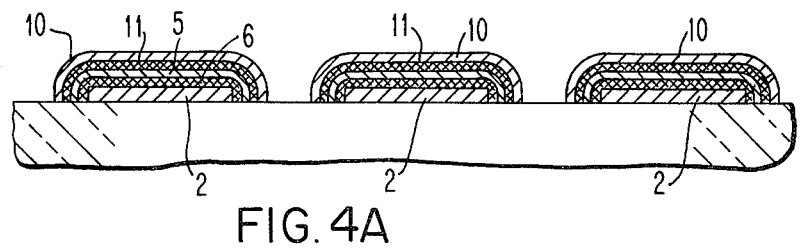

As above, on cooling, the substrate is preconditioned for ultrasonic removal of the nickel/gold films 5/10, as well as the interdiffused regions 6/11 from the bare surfaces of the substrate 1 to produce a structure such as shown in FIG. 4A.

The advantage of this variation of the processing of this invention lies in the fact that it provides for the maskless cladding of molybdenum circuit features of an alumina MLC substrate with a nickel film rich in gold at its surface, which is essentially similar to the cap structures conventionally obtained by electroless plating followed by gold plating and gold diffusion treatment.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for selectively depositing a conductive solderable or brazeable metal layer over an existing diverse metallurgical pattern supported on a dielectric substrate comprising:

blanket coating said metal over said substrate, said metal having a different thermal coefficient of contraction relative to said substrate;

heating said substrate to diffusion bond said metal to said metallurgical pattern;

cooling said substrate to spall said metal on the remaining metallurgically unpatterned portions of said substrate by the stresses induced from the differences in the thermal contraction differentials therebetween, and mechanically removing said spalled metal from said remaining unpatterned portions of said substrate.

2. The method of claim 1 wherein said metal is removed from said substrate ultrasonically.

3. The method of claim 1 wherein said substrate is formed of a ceramic material.

4. The method of claim 3 wherein said metal is removed from said substrate ultrasonically.

5. The method of claim 3 wherein said substrate comprises an alumina ceramic and said metallurgical pattern is comprised of a refractory metal.

6. The method of claim 5 wherein said metal is removed from said substrate ultrasonically.

7. The method of claim 5 wherein said metallurgical pattern is comprised of molybdenum.

8. The method of claim 7 wherein said metal is removed from said substrate ultrasonically.

9. The method of claim 7 wherein said metal is nickel.

10. The method of claim 9 wherein said metal is removed from said substrate ultrasonically.

11. The method of claim 1 including blanket depositing a conductive passivating diverse second metal layer prior to said heating over the first said metal, and interdiffusing both said metals at the interface therebetween during said heating.

12. The method of claim 11 wherein said substrate is formed of a ceramic material.

13. The method of claim 12 wherein said substrate comprises an alumina ceramic and said metallurgical pattern is comprised of a refractory metal.

14. The method of claim 13 wherein said metallurgical pattern is comprised of molybdenum.

15. The method of claim 14 wherein the first said metal is nickel.

16. The method of claim 15 wherein the said second metal is gold.

17. The method of claim 16 wherein said metal is removed from said substrate ultrasonically.

18. A method for selectively coating an existant metallurgy patten supported by a dielectric substrate with a diverse metal which is non-wettable to said substrate but mechanically adhesive to said substrate and said metal layer with said diverse metal having a higher coefficient of thermal expansion than said substrate:

blanket coating said substrate, inclusive of said existent metallurgical pattern, with said diverse metal, said diverse metal having a different thermal coefficient of contraction relative to said substrate;

heating said substrate to interdiffuse said metal to said pattern at the interface therebetween, cooling said substrate to spall said metal coating on the remaining metallurgically unpatterned portions of said substrate by the stresses induced from the differences in the thermal contraction differentials therebetween, and ultrasonically removing said spalled metal from said remaining unpatterned portions of said substrate.

19. The method of claim 18 wherein said substrate is an alumina base ceramic, said pattern is a molybdenum based metal, and said metal layer is a nickel based metal.

20. The method of claim 18 including blanket coating said substrate prior to said heating, with a second diverse conductive passivating metal layer over the first said metal layer, and interdiffusing both said metal layers at the interface therebetween during said heating.

21. The method of claim 20 wherein said substrate is an alumina base ceramic, said pattern is a molybdenum based metal, and said metal layer is a nickel based metal.

* * * * *